(12) United States Patent
Hickman et al.

(10) Patent No.: US 11,710,785 B2
(45) Date of Patent: Jul. 25, 2023

(54) RF HIGH-ELECTRON-MOBILITY TRANSISTORS INCLUDING GROUP III-N STRESS NEUTRAL BARRIER LAYERS WITH HIGH BREAKDOWN VOLTAGES

(71) Applicant: Cornell University, Ithaca, NY (US)

(72) Inventors: Austin Hickman, Ithaca, NY (US); Reet Chaudhuri, Ithaca, NY (US); Samuel James Bader, Ithaca, NY (US); Huili Grace Xing, Ithaca, NY (US); Debdeep Jena, Ithaca, NY (US)

(73) Assignee: Cornell University, Ithaca, NY (US)

( * ) Notice: Subject to any disclaimer, the term of this patent is extended or adjusted under 35 U.S.C. 154(b) by 141 days.

(21) Appl. No.: 16/893,074

(22) Filed: Jun. 4, 2020

(65) Prior Publication Data

US 2020/0388701 A1 Dec. 10, 2020

Related U.S. Application Data

(60) Provisional application No. 62/858,531, filed on Jun. 7, 2019.

(51) Int. Cl.
| | |
|---|---|
| H01L 29/778 | (2006.01) |
| H01L 29/205 | (2006.01) |
| H01L 29/08 | (2006.01) |
| H01L 29/423 | (2006.01) |
| H01L 29/66 | (2006.01) |
| H01L 29/20 | (2006.01) |

(52) U.S. Cl.
CPC ...... *H01L 29/7787* (2013.01); *H01L 29/0843* (2013.01); *H01L 29/2003* (2013.01); *H01L 29/205* (2013.01); *H01L 29/42316* (2013.01); *H01L 29/66462* (2013.01)

(58) Field of Classification Search
None
See application file for complete search history.

(56) References Cited

U.S. PATENT DOCUMENTS

| | | |
|---|---|---|
| 2005/0028346 A1 | 2/2005 | Mangone, Jr. |
| 2015/0028346 A1 | 1/2015 | Palacios et al. |

OTHER PUBLICATIONS

Qi, M. "Strained GaN quantum-well FETs on single crystal bulk AlN substrates"App. Phys. Lett. 110, Feb. 6, 2017 pp. 063501-1 through 063501-5 (Year: 2017).*

(Continued)

*Primary Examiner* — Grant S Withers
(74) *Attorney, Agent, or Firm* — Stanek Lemon Crouse & Meeks, P.A.

(57) ABSTRACT

A High Electron Mobility Transistor (HEMT) device can include an AlN buffer layer on a substrate and an epi-GaN channel layer on the AlN buffer layer. An AlN barrier layer can be on the Epi-GaN channel layer to provide a channel region in the epi-GaN channel layer. A GaN drain region can be recessed into the epi-GaN channel layer at a first end of the channel region and a GaN source region can be recessed into the epi-GaN channel layer at a second end of the channel region opposite the first end of the channel region. A gate electrode can include a neck portion with a first width that extends a first distance above the AlN barrier layer between the GaN drain region and the GaN source region to a head portion of the gate electrode having a second width that is greater than the first width.

48 Claims, 14 Drawing Sheets

(56) References Cited

OTHER PUBLICATIONS

Denninghoff, D. "Design of High-Aspect-Ratio T-Gates on N-Polar GaN/AlGaN MIS-HEMTs for High fmax" IEEE Elec. Dev. Lett. vol. 33, No. 6, Jun. 2012 pp. 785-787 (Year: 2012).*
Rennesson, S. "Ultrathin AlN-Based HEMTs Grown on Silicon Substrate by NH3-MBE" Phys. Stat. Soli. A Dec. 6, 2017 pp. 1-4 at 1700640 (Year: 2017).*
Shinohara, K. "Scaling of GaN HEMTs and Schottky Diodes for Submillimeter-Wave MMIC Applications" IEEE Trans.on Elec. Dev. vol. 60, No. 10 Oct. 2013 pp. 2982-2996 (Year: 2013).*
Li, G "Two-dimensional electron gases in strained quantum wells for AlN/GaN/AlN double heterostructure field-effect transistors on AlN"App. Phys. Lett. 104, May 14, 2014 pp. 1-5 at 193506 (Year: 2014).*
Jie et al. ("Jie" Jie, H. "◆◆g = 100 nm T-shaped gate AlGaN/GaN HEMTs on Si substrates with non-planar source/drain regrowth of highly-doped n+-GaN layer by MOCVD" Chin. Phys. B. vol. 23, No. 12 Oct. 10, 2014, pp. 128102-1 through 128102-5 (Year: 2014).*
Lanford et al. ("Lanford" Lanford, W. "AlGaN/InGaN HEMTs for RF current collapse suppression" Electronics Lett. vol. 40, No. 12, Jun. 2004 pp. 1-2 (Year: 2004).*
Green, A. "ScAlN/GaN High-Electron-Mobility Transistors with 2.4-A/mm Current Density and 0.67-S/mm Transconductance" IEEE Elec. dev. Lett. vol. 40, No. 7, first published on May 8, 2019, pp. 1056-1059 (Year: 2019).*
Murugapandiyan, P. "Design and Analysis of 20 nm t-Gate AlN/GaN HEMT with InGaN back-barrier for High power Microwave Applications" Int. Conf. on Sust. Grow. ICSGUPSTM 2018, Jun. 2018 pp. 143-150 (Year: 2018).*
Islam et al., First Demonstration of Strained AlN/GaN/AlN Quantum Well FETs on SiC, IEEE, 2016, pp. 39-40.
Li et al., "Ultrathin Body GaN-on-Insulator Quantum Well FETs With Regrown Ohmic Contacts," IEEE Electron Device Letters, vol. 33, No. 5, May 5, 2012.
Qi et al., "Strained GaN Quantum-Well FETs on Single Crystal Bulk AlN Substrates," Applied Physics Letters, Nov. 27, 2016, 4 pages.

* cited by examiner

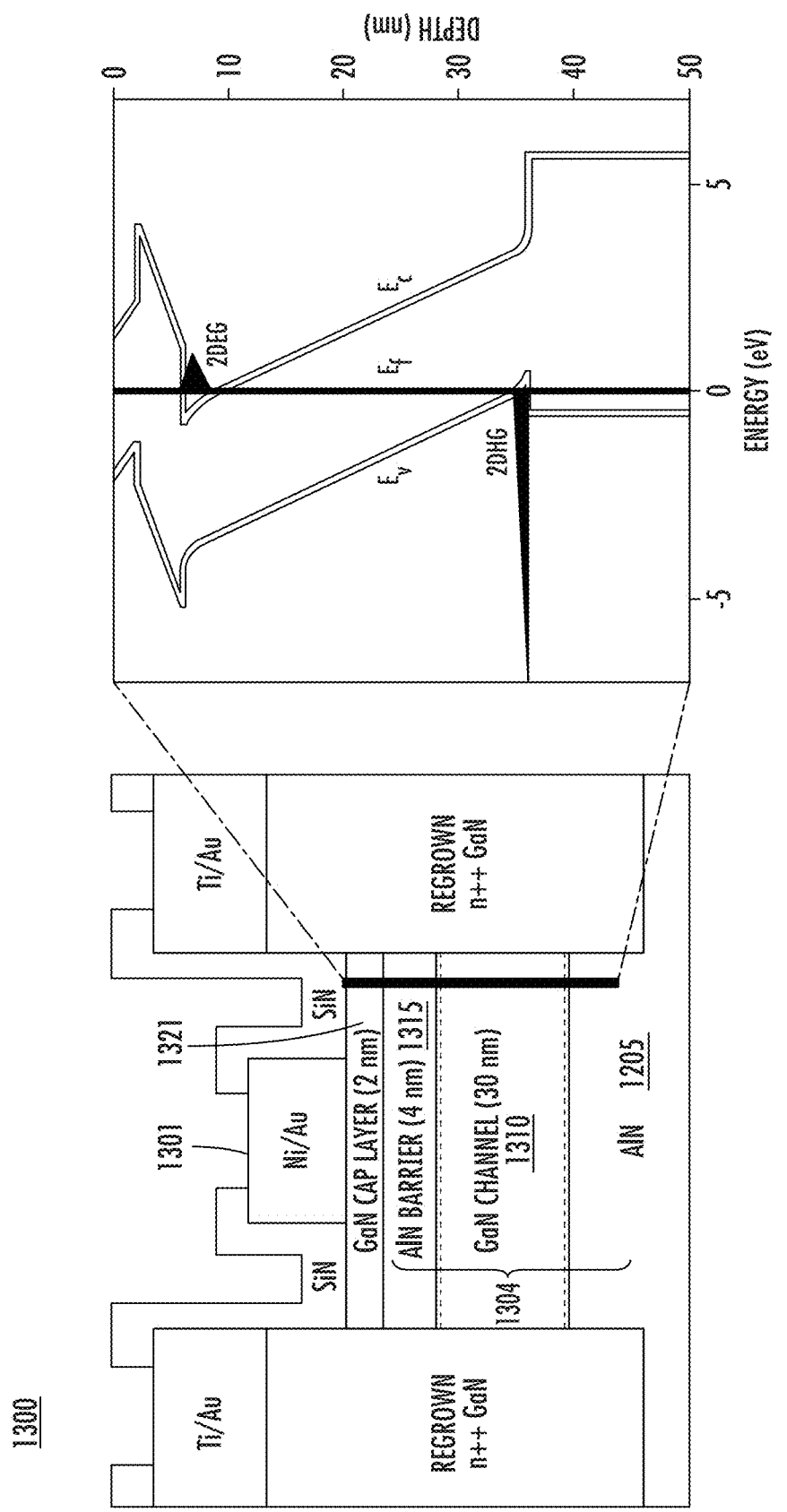

US 11,710,785 B2

RF HIGH-ELECTRON-MOBILITY TRANSISTORS INCLUDING GROUP III-N STRESS NEUTRAL BARRIER LAYERS WITH HIGH BREAKDOWN VOLTAGES

CLAIM FOR PRIORITY

This application claims priority to Provisional Application Ser. No. 62/858,531, titled Aluminum Nitride-Based High-Electron-Mobility Transistor, filed in the U.S. Patent and Trademark Office on Jun. 7, 2019, the entire disclosure of which is hereby incorporated herein by reference.

STATEMENT OF GOVERNMENT SUPPORT

This disclosure was made in part with United States Government support under Grant No. DMR-1710298 awarded by the National Science Foundation and Grant No. AFOSR FA9550-17-1-0048 awarded by the Air Force Office of Scientific Research. The United States government has certain rights in the invention.

BACKGROUND

Some GaN HEMTs include an AlGaN/GaN heterostructure. Previous demonstrations of AlGaN/GaN HEMT output power with field plating have shown over 40 W/mm at 4 GHz, 32 W/mm at 8 GHz and up to 10 W/mm at 30 GHz. By significantly enhancing device breakdown, field plates also increase output power, but due to the complexity of properly implementing field plates in highly-scaled RF devices, it can be valuable, for the purpose of evaluating the potential for a new heterostructure, to compare devices without field-shaping. Without field plates, the AlGaN/GaN and other heterostructures have been assessed, with AlGaN/GaN HEMTs showing 10.5 W/mm at 40 GHz and InAlGaN barrier HEMTs showing 3 W/mm at 96 GHz. N-polar GaN HEMTs have demonstrated over 8 W/mm at the range of 10 to 94 GHz. In current non-field-plated GaN HEMTs technologies, device breakdown voltage can limit the maximum output power of the device.

To further increase the HEMT breakdown voltage while improving mm-wave performance, AlN/GaN/AlN HEMT devices have been used. AlN/GaN/AlN HEMTs with rectangular shaped gate electrodes have shown high on-currents at 2.8 A/mm, and small-signal measurements for rectangular gate devices yielded a cutoff frequency (ft) of 120 GHz.

SUMMARY

Embodiments according to the invention can provide RF high-electron-mobility transistors including group iii-n stress neutral barrier layers with high breakdown voltages. Pursuant to these embodiments, a High Electron Mobility Transistor (HEMT) device can include an AlN buffer layer on a substrate and an epi-GaN channel layer on the AlN buffer layer. An AlN barrier layer can be on the Epi-GaN channel layer to provide a channel region in the epi-GaN channel layer. A GaN drain region can be recessed into the epi-GaN channel layer at a first end of the channel region and a GaN source region can be recessed into the epi-GaN channel layer at a second end of the channel region opposite the first end of the channel region. A gate electrode can include a neck portion with a first width that extends a first distance above the AlN barrier layer between the GaN drain region and the GaN source region to a head portion of the gate electrode having a second width that is greater than the first width.

In some embodiments, a High Electron Mobility Transistor (HEMT) device can include a group III-N buffer layer on a substrate and a group III-N channel layer having a thickness of less than 30 nm that is either strained or lattice matched to and on the group III-N buffer layer. A group III-N barrier layer can be on the group III-N channel layer, where the group III-N barrier layer can be unstrained, or have a stress in a range between about −200 Mpa and about +200 MPa and to provide a channel region. A group III-N drain region can be recessed into the group III-N channel layer at a first end of the channel region and a group III-N source region can be recessed into the group III-N channel layer at a second end of the channel region opposite the first end of the channel region and a T-shaped gate electrode can be between the group III-N drain region and the group III-N source region.

BRIEF DESCRIPTION OF THE DRAWINGS

FIG. 13 is a cross-sectional view of an AlN/GaN/AlN HEMT device in some embodiments according to the invention.

FIG. 14 is a calculated energy band diagram corresponding to the AlN/GaN/AlN HEMT device of FIG. 13 in some embodiments according to the invention.

DETAILED DESCRIPTION OF EMBODIMENTS ACCORDING TO THE INVENTION

Figure 1:
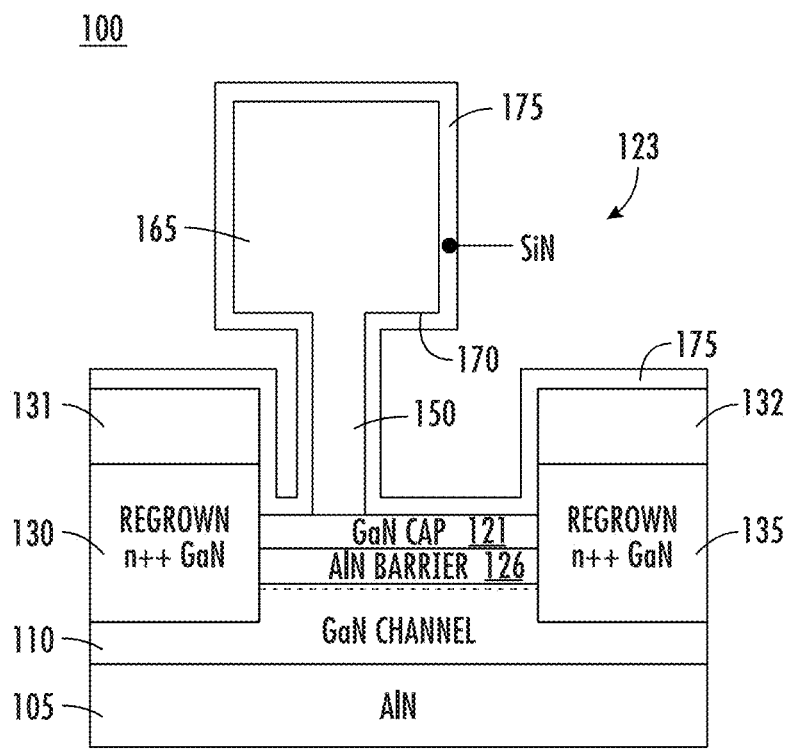
FIG. 1 is a cross-sectional view of an AlN/GaN/AlN HEMT device including a T-shaped gate electrode in some embodiments according to the invention.

In the description that follows, like components have been given the same reference numerals, regardless of whether they are shown in different examples. To illustrate example(s) in a clear and concise manner, the drawings may not necessarily be to scale and certain features may be shown in somewhat schematic form. Features that are described and/or illustrated with respect to one example may be used in the same way or in a similar way in one or more other examples and/or in combination with or instead of the features of the other examples.

As used in the specification and claims, for the purposes of describing and defining the disclosure, the terms about and substantially are used to represent the inherent degree of uncertainty that may be attributed to any quantitative comparison, value, measurement, or other representation. The terms about and substantially are also used herein to represent the degree by which a quantitative representation may vary from a stated reference without resulting in a change in the basic function of the subject matter at issue. Comprise, include, and/or plural forms of each are open ended and include the listed parts and can include additional parts that are not listed. And/or is open-ended and includes one or more of the listed parts and combinations of the listed parts.

As appreciated by the present inventors, the inclusion of a T-shaped gate electrode in an AlN/GaN/AlN HEMT device may improve both the breakdown voltage for the device as well as improve the RF on-current and maximum operating frequency (Fmax). In particular, the T-shaped gate electrode geometry can allow the electric field generated at the gate electrode to be spaced apart from the GaN drain region and also can allow the electric field to be spread over a wider area in the AlN barrier layer so that the electric field can have a reduced peak in the AlN barrier layer for improved breakdown voltage performance. Further, the T-shape gate electrode can provide improved RF performance as evidenced, for example, by improved Ft/Fmax performance relative to rectangular gate electrode geometry. Electrodes with other types of shapes, such as gamma-shaped electrodes, may also provide these types of performance improvements.

As further appreciated by the present inventors, the inclusion of other materials, such as Sc, in the AlN barrier layer may provide improved polarization of the electric field so that better modulation of the 2DEG channel may be achieved. In some embodiments, the epi-GaN channel layer may be formed to include other materials, such as In or Al.

Still further, the epi-GaN channel layer can be strained by formation on the AlN buffer layer to provide a strained GaN quantum well for the HEMT device. Moreover, the strained epi-GaN channel layer can enable the AlN barrier to be formed to be stress-neutral so that the resulting material has a high bandgap and can enable the resulting device to be processed with a reduced likelihood of stress induced degradation or cracking. Further, the stress-neutral property of the AlN barrier layer may enable the AlN layer to have reduced thickness and to be formed closer to the surface of HEMT device.

It will be understood that the terms "stress-neutral" or "strain-free" or the like can include embodiments where the AlN barrier layer is relatively low strain. In some embodiments, the terms "stress-neutral" or "strain-free" or the like can include embodiments where the AlN barrier layer exhibits strain in the range of −200 MPa to about +200 MPa and still provide the properties described herein.

As further appreciated, HEMT devices according to the present invention can be provided using other group III materials with N so that the buffer layer and the channel layer are lattice matched and the channel layer is less than about 30 nm thick while the group III barrier layer exhibits a stress in a range between about −200 Mpa and about +200 MPa and the gate electrode is a T-shaped geometry.

FIG. 1 is a cross-sectional view of an AlN/GaN/AlN HEMT device 100 including a T-shaped gate electrode 123 in some embodiments according to the invention. As shown in FIG. 1, AlN/GaN/AlN HEMT device 100 can include an AlN buffer layer 105 formed on a substrate, such as SiC, AlO, Silicon, AlN, or the like. The AlN buffer layer 105 can be formed to a thickness in a range between about 350 nm to about 500 nm, although other thickness can also be used. The AlN buffer layer 105 can be formed using any type of process that provides for epitaxial formation of the AlN buffer layer 105, such as MBE, MOCVD, or the like.

A GaN channel layer 110 can be epitaxially grown on the AlN buffer layer 105 so that the lattice of the GaN channel layer 110 is matched to the lattice of the AlN buffer layer 105, resulting in a compressively strained GaN channel layer 110. The GaN channel layer 110 can be formed to a thickness in a range between about 1 nm to about 300 nm, although other thickness can also be used. The GaN channel layer 110 can be formed to include other materials, such as In or Al. In some embodiments, the composition of the GaN channel layer 110 is formed according to the relationship provided by InxGa(1−x)N, wherein x is in a range between greater than about 0.08 to about 0.12, although other compositions may be used. The composition of the In or Al in the GaN channel layer can be graded or uniform throughout the thickness.

An AlN barrier layer 115 can be formed on the GaN channel layer 110 to provide a heterojunction for the HEMT device wherein a channel region 126 can be formed in the GaN channel layer 110 near the heterojunction device operation. It will be understood that the channel region 126 can be a 2DEG channel region. In some embodiments, the AlN barrier layer 115 is epitaxially grown on the GaN channel layer 110. It will be understood that because the epi-GaN channel layer 110 is lattice matched (i.e. compressively strained) to the AlN buffer layer 115, the AlN barrier layer 115 can be formed at relatively low stress (i.e. the GaN channel layer 110 provides a surface which allows the AlN barrier layer 115 to grow epitaxially relatively un-strained). It will be understood that the AlN barrier layer 115 can exhibit a strain in the range of −200 MPa to about +200 MPa and still be considered relatively stress-neutral in some embodiments according to the invention. The AlN barrier layer 115 can be formed to a thickness of about 5 nm, although other thickness can also be used. The AlN barrier layer 115 can be formed about 2 nm or less from a surface of the HEMT device 100. In some embodiments, the AlN barrier layer 115 can be formed to include Sc. In some embodiments, the composition of Sc in the AlN barrier layer 115 is formed according to the relationship provided by ScxAl(1−x)N, wherein x is in a range between greater than about 0.01 to about 0.2, although other compositions may be used. The composition of the Sc in the AlN barrier layer 115 can be graded or uniform throughout the thickness.

As further shown in FIG. 1, the HEMT device 100 can include a GaN cap layer 121 formed on the AlN barrier layer 115. The GaN cap layer 121 can be formed to a thickness of about 2 nm, although other thicknesses may be used. In some embodiments according to the invention, the GaN cap layer 121 is omitted, such as those shown in FIGS. 10 and 12. The materials describe above provide what is sometimes referred to herein as the HEMT materials stack.

Source and drain recesses can be formed spaced apart in the HEMT materials stack to expose the GaN channel layer 110 provide for the formation of the formation of n++GaN source and drain regions 130 and 135, respectively. In some embodiments, the n++GaN source and drain regions 130, 135 are epi-grown. Other techniques may be used. The n++GaN source and drain regions 130, 135 are formed spaced apart to provide for the channel region 123 therebetween to have a length L. Ohmic contacts are formed on the n++GaN source and drain regions 130 and 135. In some embodiments, the ohmic contacts 131 and 132 include a metal or a combination of metals, such as Ti and/or Au. Other metals may also be used.

As further shown in FIG. 1, a T-shaped gate electrode 123 is formed to include a neck portion 150 that contacts the GaN cap layer 121 and extends away from the channel region 125 with a first width 155 to a first distance 160 from the MN barrier layer 115. The neck portion 150 is located offset from the drain region 135 more than the source region 130. In some embodiments, the neck portion 150 is located about 200 nm from the source region 130.

At the first distance 160 from the MN barrier layer 115, the T-shaped gate electrode 123 transitions to a head portion 165 that has a second width that is wider than the neck portion 150 first width 155. Accordingly, the head portion 165 includes a lower overhang portion 170 that cantilevers over the MN barrier layer 115 and extends toward the drain region 130. In some embodiments, the T-shaped gate electrode 123 includes a metal or a combination of metals, such as Ni and/or Au. Other metals may also be used.

A SiN passivation layer 175 can be formed over the ohmic contacts, the T-shaped gate electrode 123 and the GaN cap layer 121. In some embodiments, an amorphous AlN passivation layer is formed on the GaN cap layer 121 instead of the SiN passivation layer 175.

An AlN/GaN/AlN HEMT device 100 was grown by plasma-assisted Molecular Beam Epitaxy (MBE) for evaluation on highly resistive 6H silicon carbide. The device 100 was composed of a 500 nm MN buffer layer, a 200 nm GaN channel layer, a 5 nm MN barrier layer, and a 2 nm GaN layer, as shown in FIG. 1. Hall-effect measurements in Van der Pauw configuration were performed on the as-grown device, demonstrating a room temperature 2DEG concentration of $3 \cdot 10^{13}$ cm-2 and electron mobility of 723 cm2/V·s, resulting in a sheet resistance of 293 Ω/sq.

To study the observed mobility limitations and the potential effect of the 2-dimensional hole gas (2DHG) that forms at the GaN channel/AlN buffer interface, the GaN channel for the device 100 was increased from 30 nm in thickness to 200 nm, but it is preferable to scale down the GaN channel thickness while achieving 2DEG mobilities greater than about 1500 cm2/V·s.

Figure 2:
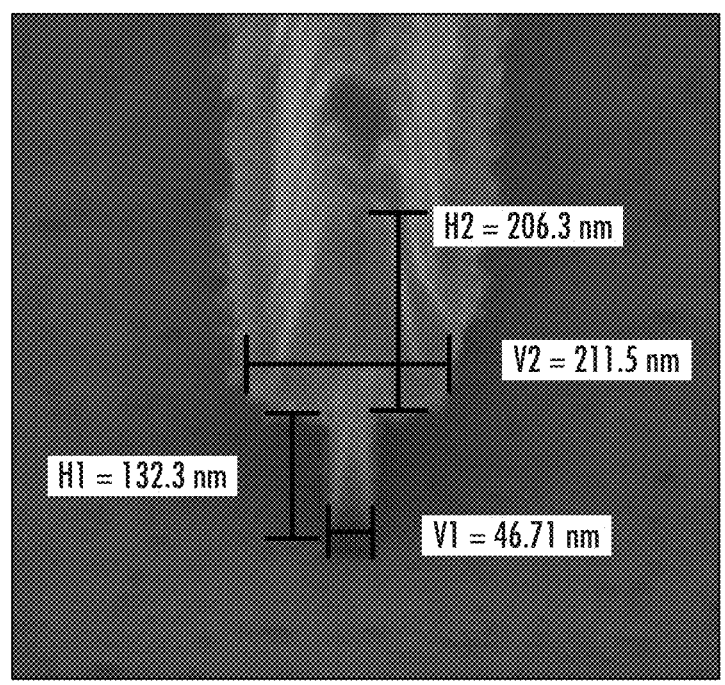
FIG. 2 is an SEM image of an exampleexample T-shaped gate electrode included in an AlN/GaN/AlN HEMT device formed to have a gate length LG<50 nm in some embodiments according to the invention.

Device fabrication began with the regrown ohmic contact process. The as-grown heterostructure was masked with SiO2/Chromium, patterned for source/drain contacts, and dry-etched by chlorine-based inductively-coupled plasma (ICP) to expose the 2DEG sidewall in the GaN channel layer. The sample was then loaded into the MBE chamber, and n++ GaN ([Si]~1020 cm-3) was grown to form ohmic contacts to the 2DEG. The devices were isolated by another chlorine-based ICP etch, and Ti/Au (50/100 nm) ohmic metals were deposited via e-beam evaporation on top of the regrown GaN without annealing. The T-shaped gate electrode was formed using a tri-layer resist stack, and a single electron beam lithography (EBL) exposure. Ni/Au (50/200 nm) T-shaped gate electrode metals were deposited by e-beam evaporation. The T-shaped gate electrode was aligned to the regrown GaN, and offset towards the source contact (LGS=200 nm) to enhance device breakdown. An example formed T-shaped gate electrode is shown with example dimensions in FIG. 2.

The HEMTs were passivated with 40 nm of plasma-enhanced chemical vapor deposition silicon nitride (PECVD SiN). The passivation was removed on the gate, drain, and source probe pads, which were then thickened with an additional Ti/Au (50/300 nm) layer via e-beam evaporation.

Figure 4:
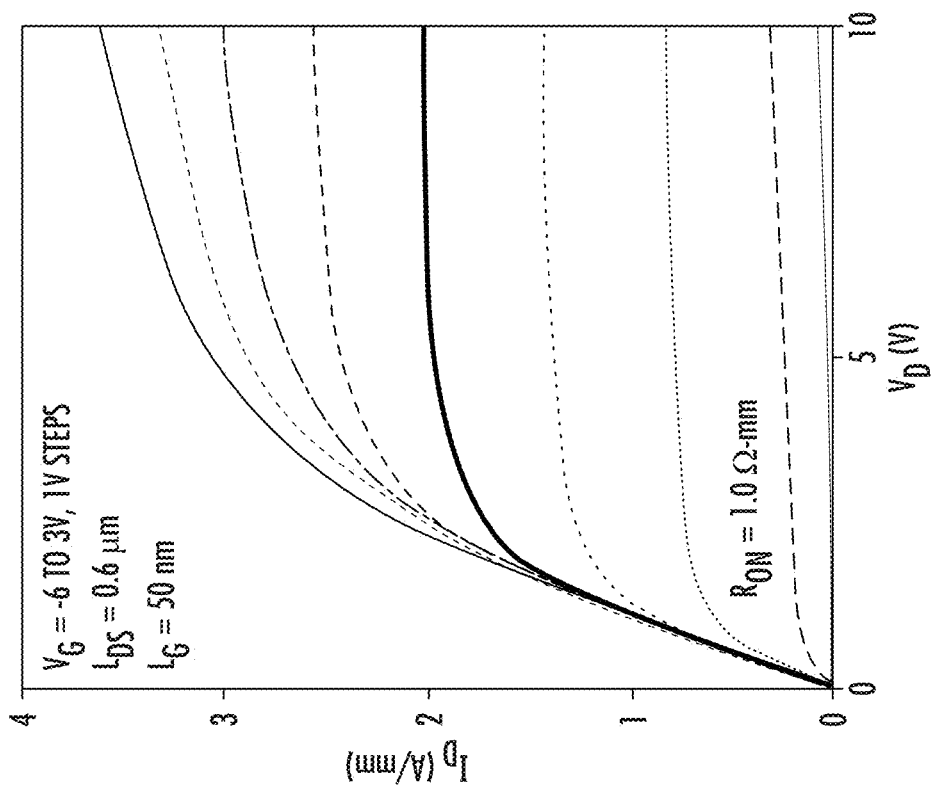
FIG. 4 is a graph of output characteristics for an example AlN/GaN/AlN HEMT device in some embodiments according to the invention.
Figure 3:
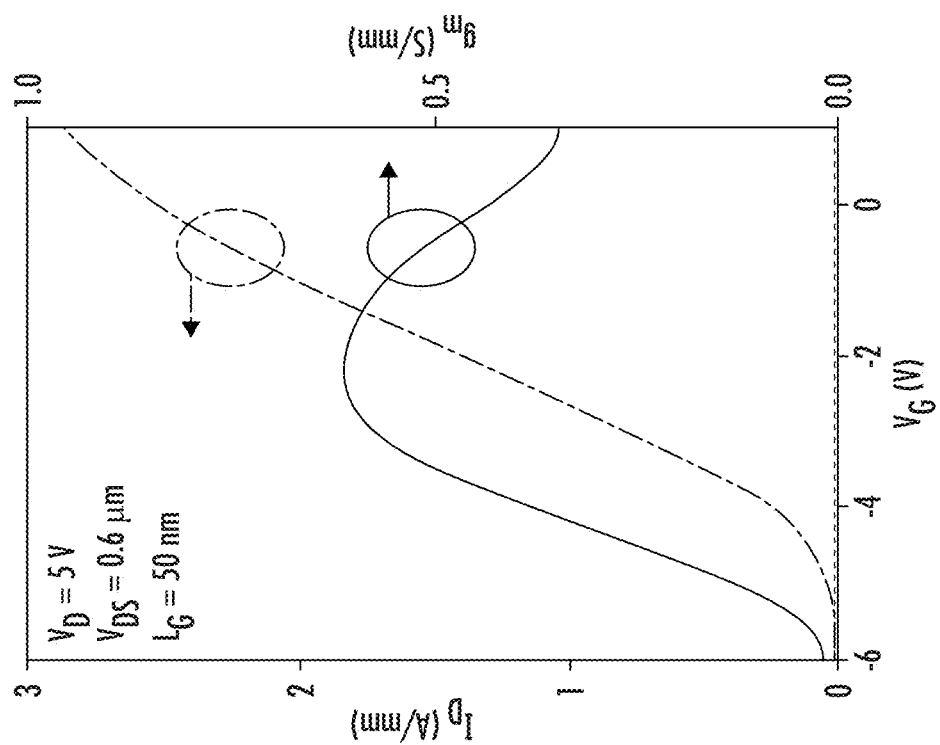
FIG. 3 is a graph of DC transfer characteristics for an example AlN/GaN/AlN HEMT device in some embodiments according to the invention.

The contact resistance was measured via transfer-length-method (TLM) test structures, which include the metal contacts to regrown GaN resistance, as well the regrown GaN to 2DEG resistance. The total contact resistance was 0.15 Ω·mm. DC current-voltage transfer measurements, FIG. 3, showed a threshold voltage of −4 V, with a transconductance (gm) of 0.6 S/mm. Output measurements revealed a typical on-resistance of 1 Ω·mm, and drain currents above 3 A/mm for nearly all HEMTs measured, with the highest drain current (ID) of 3.6 A/mm, as shown in FIG. 4.

Figure 6:
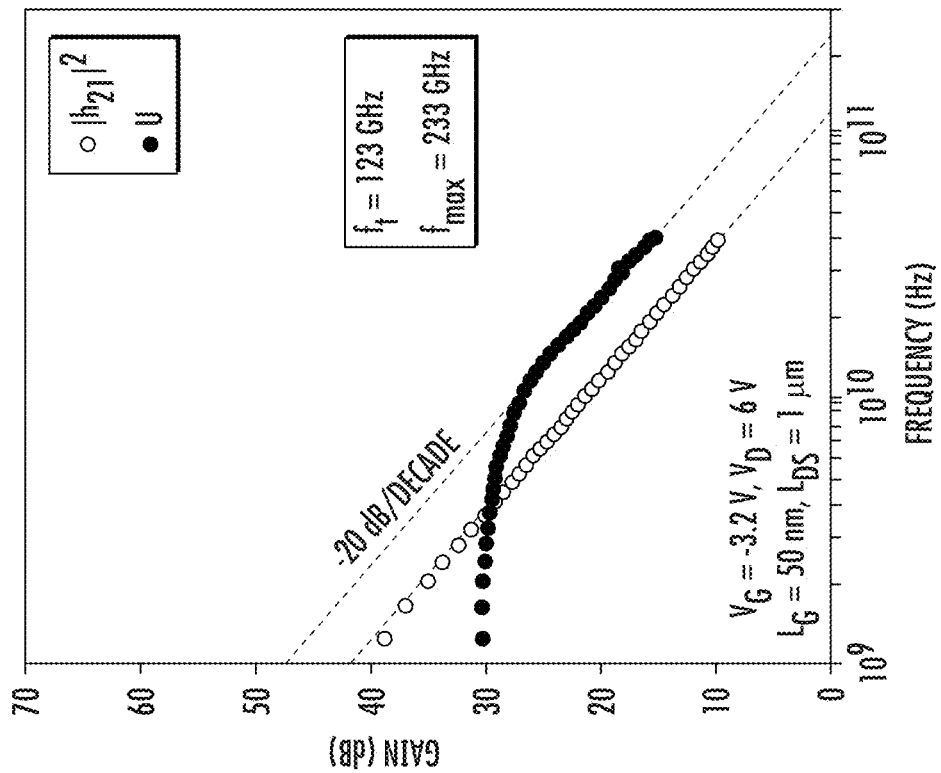
FIG. 6 is a graph showing the small-signal characteristics for an example AlN/GaN/AlN HEMT device with LG=50 nm, with a resulting ft/fmax=123/233 GHz in some embodiments according to the invention.
Figure 5:
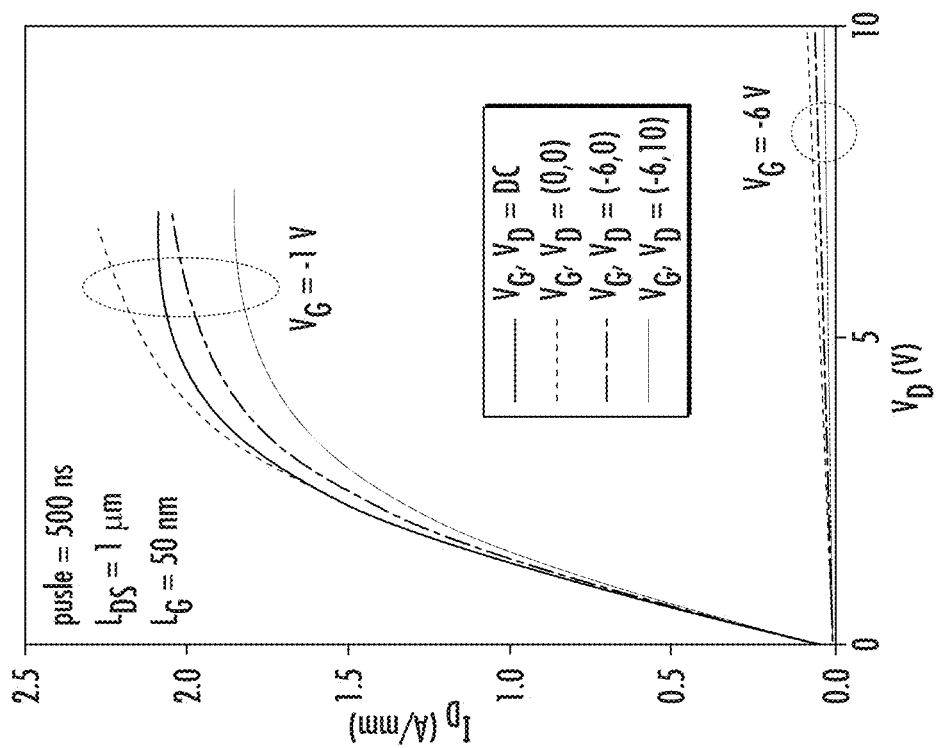
FIG. 5 is a graph showing the drain current-drain voltage ID-VD measurements of an example AlN/GaN/AlN HEMT device provided with a 500 ns pulse, at a gate voltage bias of VG=−6 V and −1 V showing a 20% dispersion in the saturation region and about a 1 V knee voltage walkout at 10 V drain lag conditions in some embodiments according to the invention.

Pulsed ID—VDS measurements were performed after SiN passivation using a 500 ns pulse and 0.05% duty cycle. The device demonstrated an on-current dispersion of 20% and ~1 V knee voltage walkout for quiescent gate/drain biases of −6/10 V, as shown in FIG. 5. Bias-dependent S-parameters were then measured in the range of 0.05-40 GHz. The system was de-embedded via a short-open-load-through impedance standard substrate and on-wafer open/short structures. The device measured for dispersion also demonstrated ft=123 GHz, fmax=233 GHz, as shown in FIG. 6. This is Fmax for the AlN/GaN/AlN heterostructure can be attributed to the incorporation of the T-shaped gate electrode geometry.

Figure 7:
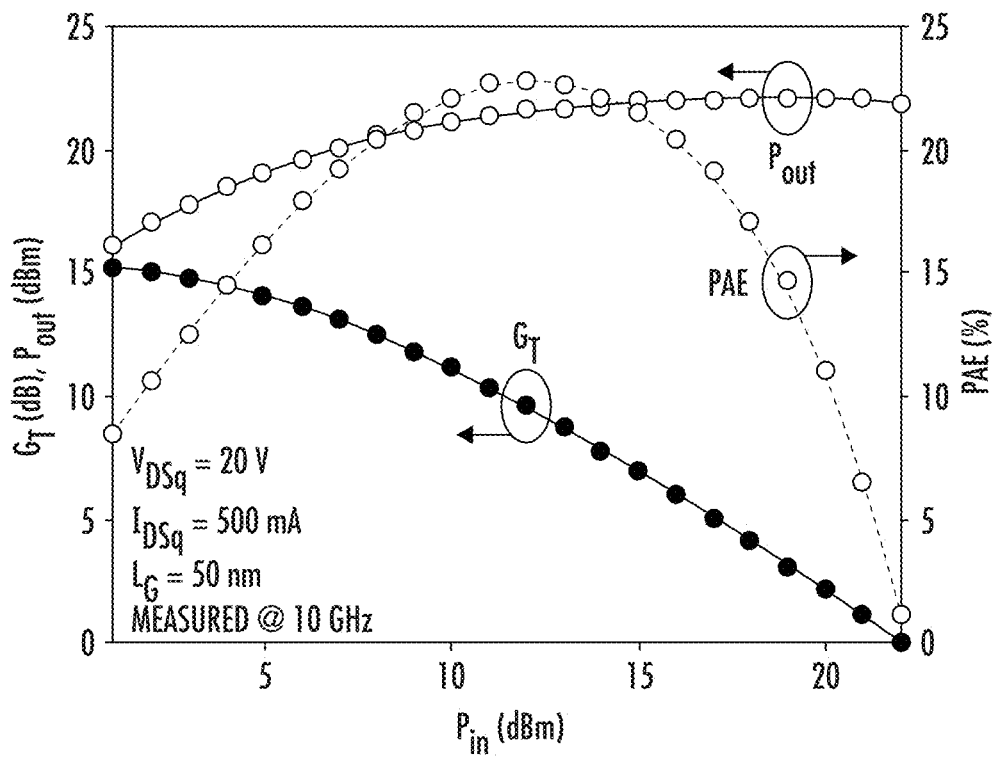
FIG. 7 is a graph showing load-pull power sweep for an example AlN/GaN/AlN HEMT device at 10 GHz biased in Class AB operation (VDSq=20V, IDSq=500 mA/mm) in some embodiments according to the invention.

Large-signal performance was evaluated using a Maury load-pull system at 10 GHz. The device was biased in Class AB conditions, with an IDSq of 500 mA/mm and VDSq of 20 V. FIG. 7 shows the power sweep results for the 2×25 μm device, demonstrating a peak output power of 22.2 dBm, equivalent to 3.3 W/mm, with an associated PAE of 14.7% and GT of 3.2 dB. The peak PAE of 22.9% had an associated Pout of 2.9 W/mm and GT of 9.6 dB.

Figure 8:
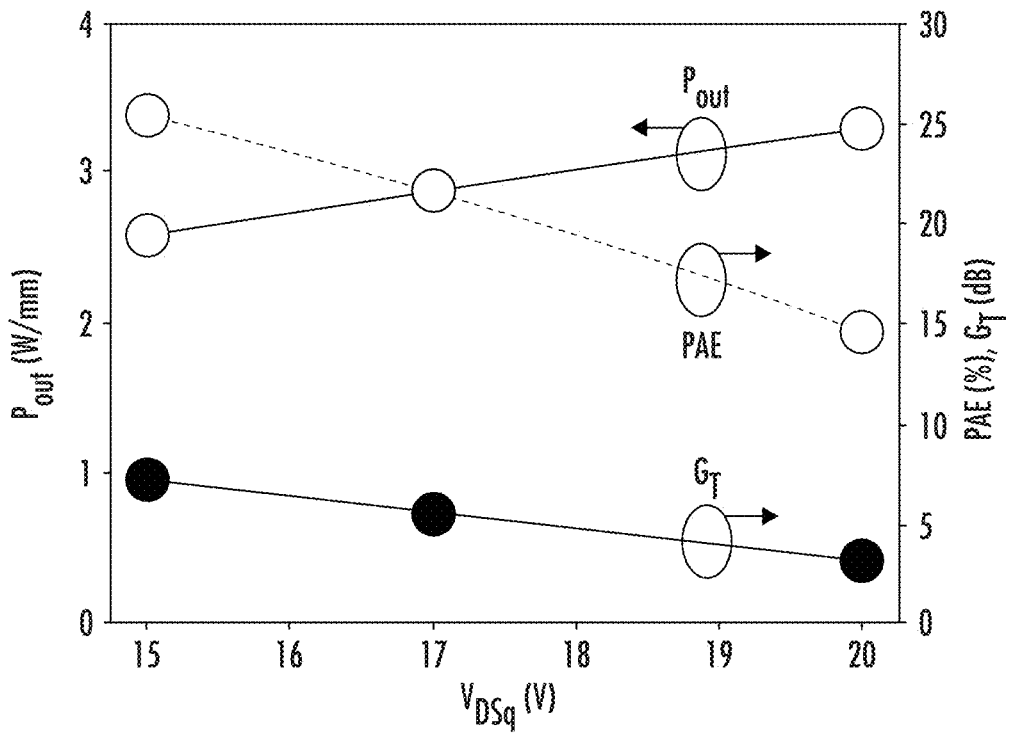
FIG. 8 is a graph showing output power, gain, and PAE for an example AlN/GaN/AlN HEMT microwave amplifier device at VDSq values of 15, 17, and 20 V in some embodiments according to the invention.

The saturated output power of 3.3 W/mm is hampered by the soft gain compression, which becomes limiting as the input power increases. This is likely caused by surface traps and back gating from charge trapping at the AlN/SiC interface. This is also supported in FIG. 8, where the GT and PAE of the device decrease for an increasing VDSq.

FIGS. 9-12 show alternative embodiments of the HEMT device 100 including with varied T-shaped gate electrode geometry and with variation in the arrangement of some of the layers shown in FIG. 1 in some embodiments.

Figure 9:
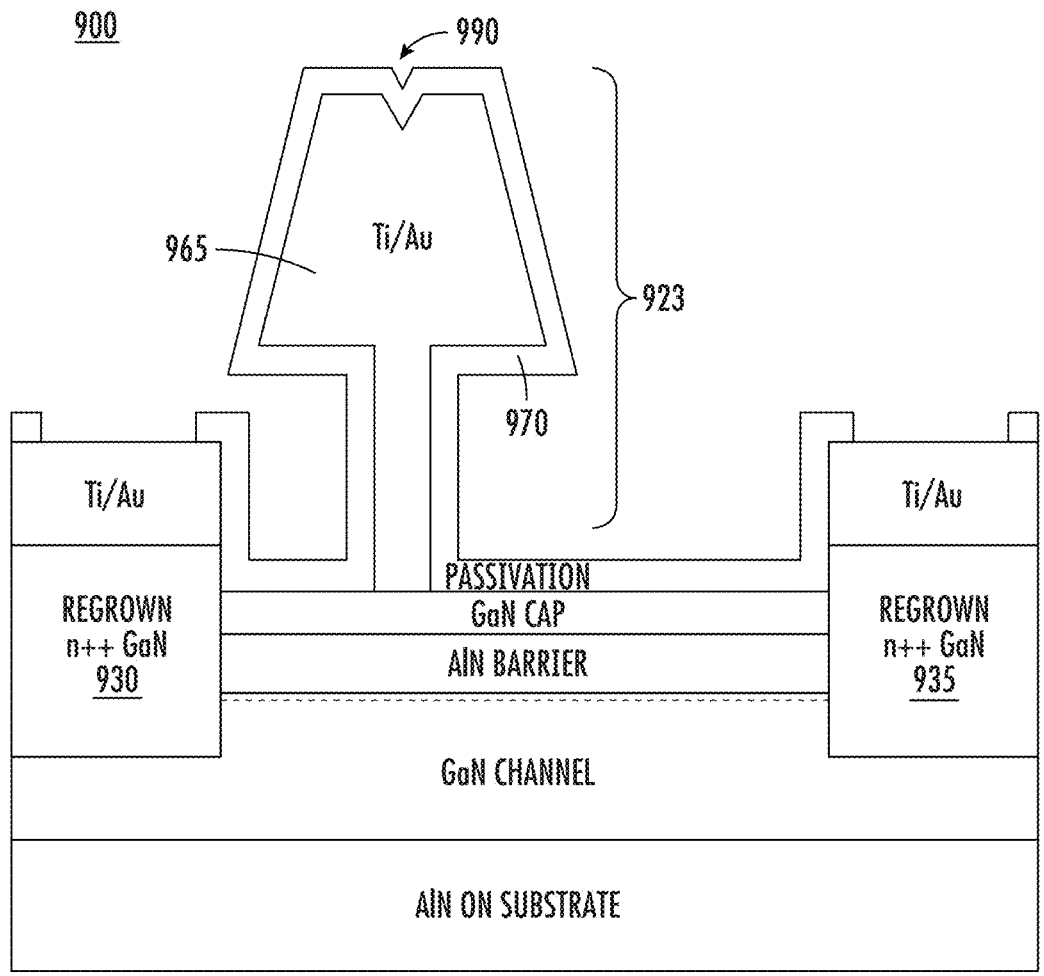
FIG. 9. is a cross-sectional view of an AlN/GaN/AlN HEMT device including a T-shaped gate electrode with sloped side walls in some embodiments according to the invention.

FIG. 9. is a cross-sectional view of an AlN/GaN/AlN HEMT device 900 including a T-shaped gate electrode 923 with sloped side walls that are tapered inward so that an uppermost portion of the head 965 has a width that is less than the width at the lower overhang portion 970. As further shown in FIG. 9, the upper surface of the head portion 965 can have a recess 990 in some embodiments according to the invention.

Figure 10:
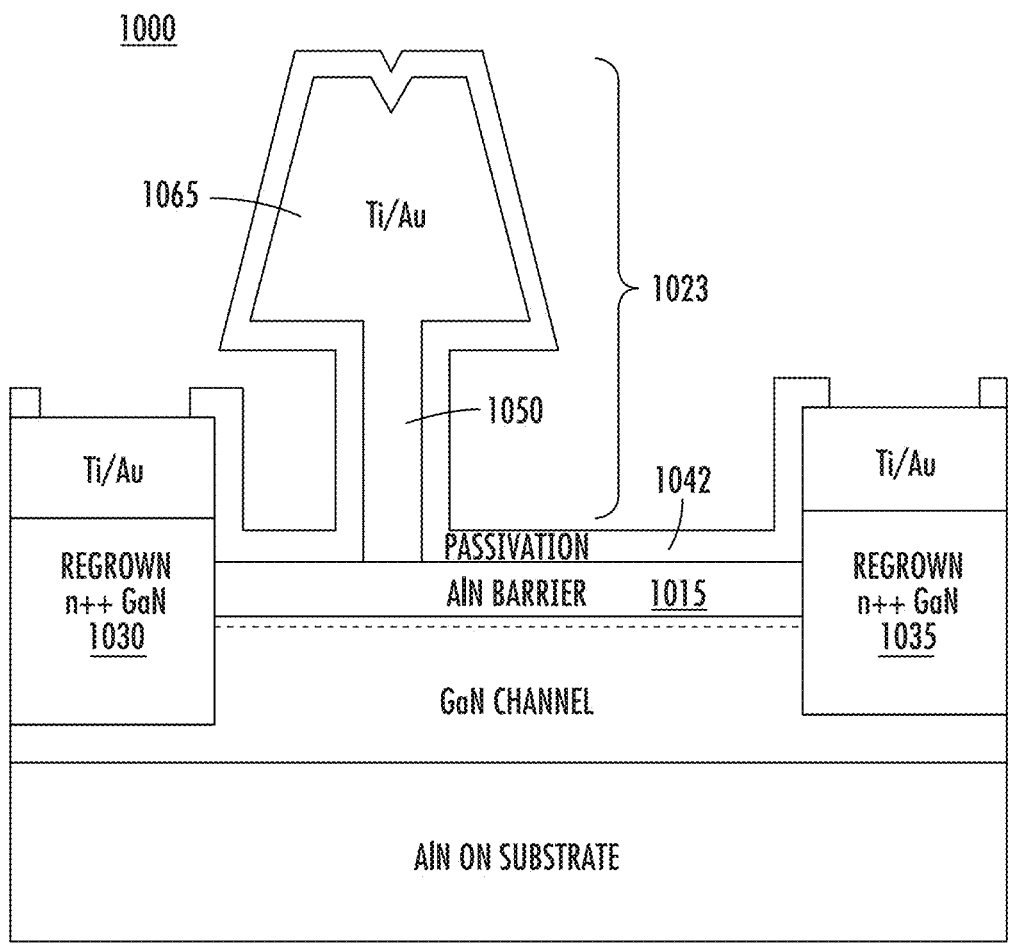
FIG. 10 is a cross-sectional view of an AlN/GaN/AlN HEMT device including a T-shaped gate electrode with a neck portion contacting an upper surface of the AlN barrier layer in some embodiments according to the invention.

FIG. 10 is a cross-sectional view of an AlN/GaN/AlN HEMT device including a T-shaped gate electrode 1023 with a neck portion 1050 contacting an upper surface of the AlN barrier layer 1015 in some embodiments according to the invention. As further shown, the GaN cap layer 121 shown in FIG. 1 has been omitted and a passivation layer 1042 is formed to contact the AlN barrier layer 1015 in some embodiments. It will be understood that the head of the T-shaped gate electrode 1023 may have the sloped side walls described in FIG. 9.

Figure 11:
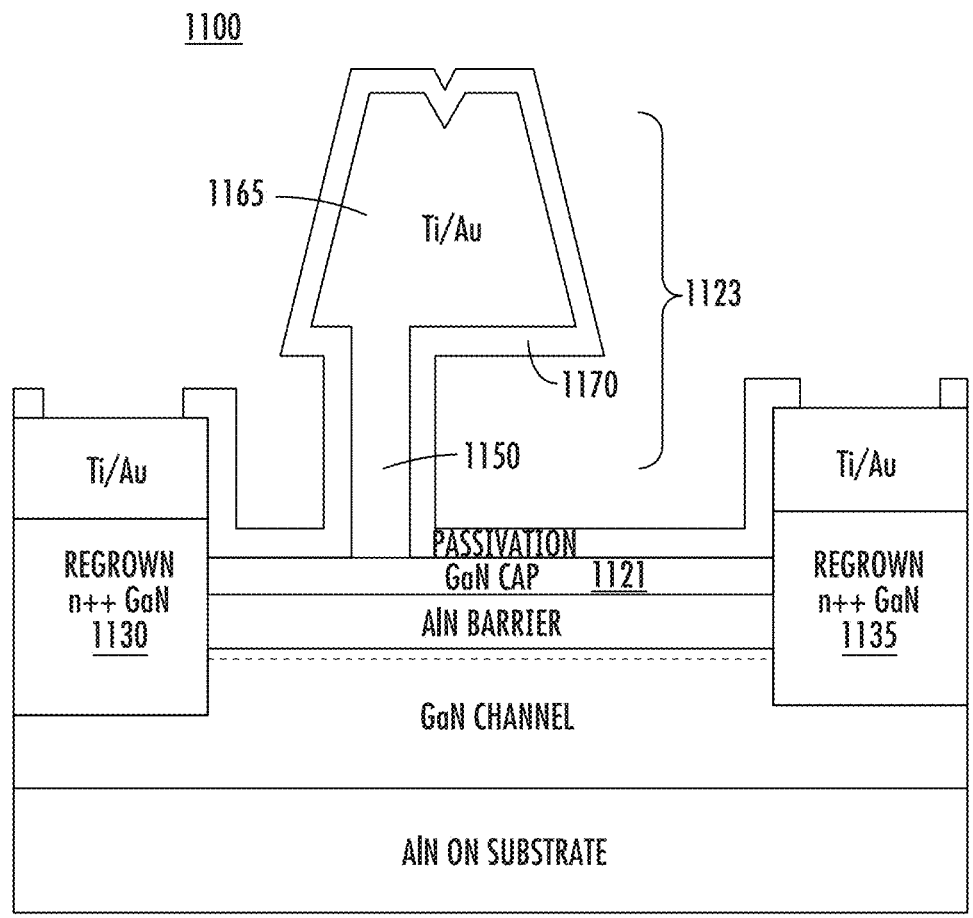
FIG. 11 is a cross-sectional view of an AlN/GaN/AlN HEMT device including a T-shaped gate electrode with a head portion that is offset toward the drain region relative to the neck portion in some embodiments according to the invention.

FIG. 11 is a cross-sectional view of an AlN/GaN/AlN HEMT device 1100 including a T-shaped gate electrode 1123 with a head portion 1165 that is offset toward the drain region 1135 relative to the neck portion 1150 in some embodiments according to the invention. Accordingly, the lower overhang portion 1170 of the lower surface of the head 1165 that extends toward the GaN drain region 1135 may be asymmetrical relative to the other side of the neck portion 1150. The GaN cap layer 121 shown in FIG. 1 may be omitted and the passivation layer formed to contact the AlN barrier layer in some embodiments.

Figure 12:
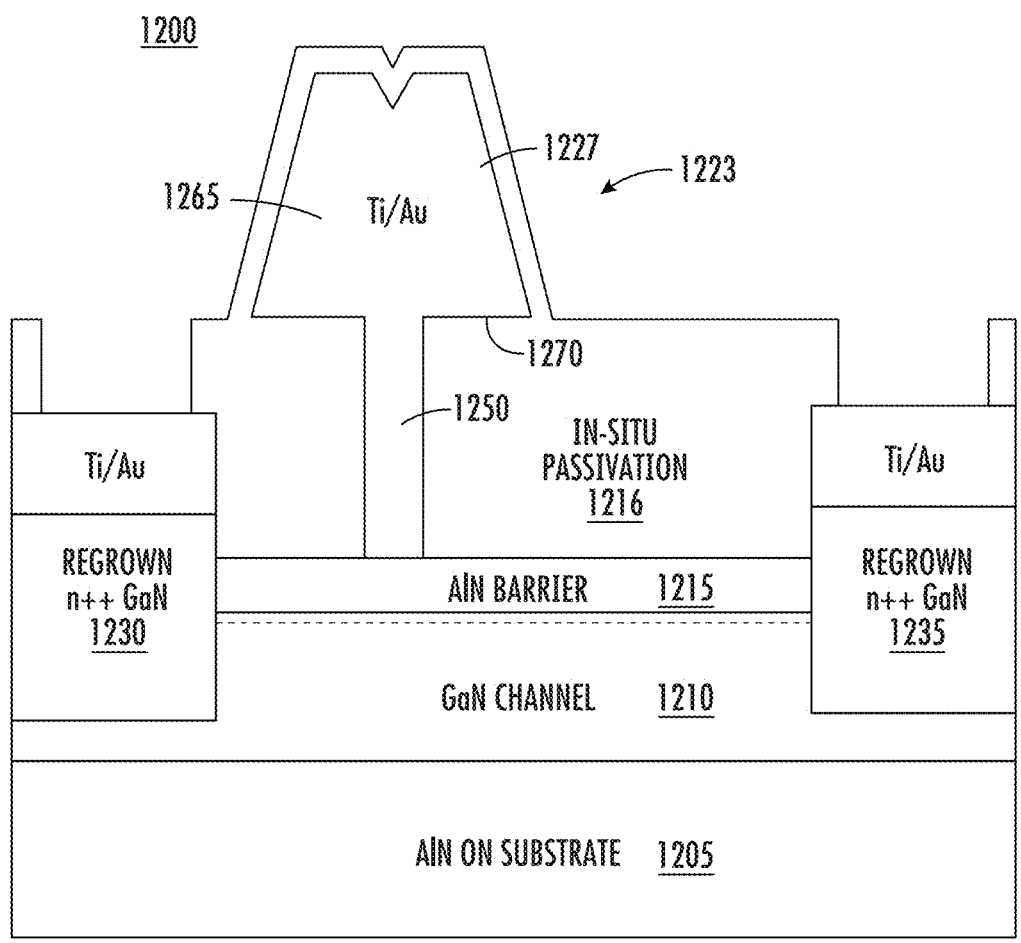
FIG. 12 is a cross-sectional view of an AlN/GaN/AlN HEMT device including a T-shaped gate electrode with a neck portion contacting an upper surface of the AlN barrier layer and including an in-situ passivation layer on the AlN barrier layer and on the source and drain regions in some embodiments according to the invention.

FIG. 12 is a cross-sectional view of an AlN/GaN/AlN HEMT device 1200 including a T-shaped gate electrode 1223 with a neck portion 1250 contacting an upper surface of the AlN barrier layer 1215 and including an in-situ passivation layer 1216 on the AlN barrier layer 1215 and on the source and drain regions in some embodiments according to the invention. As further shown, the GaN cap layer 1215 shown, for example in FIG. 1 is omitted and the in-situ passivation layer 1216 is between the upper surface of the AlN barrier layer 1215 and the lower overhang portion 11270 of the head. In some embodiments, it will be understood that the head of the T-shaped gate electrode 1223 may have the sloped side walls described in FIG. 9.

In still further embodiments according to the invention, an AlN/GaN/AlN HEMT device 1300 may be formed with a rectangular gate electrode 1301, as shown for example in FIG. 13. The AlN/GaN/AlN epitaxial structures 1304 of FIG. 13 were grown by plasma-assisted molecular beam epitaxy (MBE) on semi-insulating 6H silicon carbide substrates. As shown in FIG. 13 the heterostructure was formed of a 350 nm AlN buffer layer 1305, a 30 nm GaN channel 1310, a 4 nm AlN barrier 1315, and a 2 nm GaN layer 1321. Room temperature Hall-effect measurements prior to device fabrication showed a two-dimensional electron gas (2DEG) sheet concentration of $2.9 \cdot 10^{13}$ cm-2 and electron mobility of 630 cm2/V·s, corresponding to a sheet resistance of 340 ℧ /sq.

An energy band diagram of the as-grown heterostructure simulated via self-consistent solution of the Poisson and Schrodinger equations shown in FIG. 14 shows the formation of a 2DEG at the top AlN/GaN heterojunction. The simulation also indicates the formation of a 2DHG at the bottom GaN/AlN heterojunction. The 2DHG was experimentally detected in the AlN/GaN/AlN heterostructure via terahertz spectroscopy, and it was confirmed by electrical transport in an undoped GaN/AlN heterostructure. The 2DHG may act to enhance the breakdown voltage of the HEMT by the superjunction effect.

The device fabrication used a realigned gate-last process. The heterostructure was patterned with a SiO2/chromium hard mask and etched via BCl3 inductively coupled plasma (ICP) to expose the 2DEG sidewall. The sample was loaded back into the MBE, and regrown n++ GaN (ND~1020 cm-3) source/drain contacts were formed. The SiO2/Cr mask was removed via HF, and device isolation was achieved by another BCl3 ICP etch that extended 20 nm into the AlN buffer. Ti/Au (50/50 nm) non-alloyed ohmic contacts were deposited by e-beam evaporation on top of the regrown GaN source/drain regions.

Figure 21:
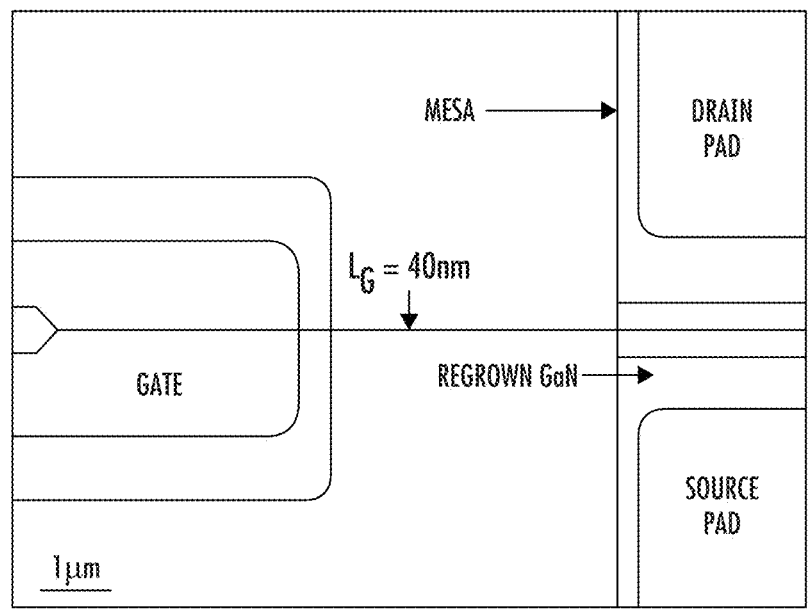
FIG. 21 is a SEM image of an AlN/GaN/AlN HEMT device with LG=40 nm in some embodiments according to the invention.

Long-channel gates were patterned by photolithography, and Ni/Au (50/50 nm) Schottky contacts were deposited by e-beam evaporation directly on the sample surface. Submicron channel devices were patterned for RF gates using electron beam lithography (EBL) with a PMMA bilayer. Ni/Au (20/50 nm) Schottky contacts were deposited via e-beam evaporation directly on the sample surface. Gate lengths as short as 40 nm were observed via SEM, shown in FIG. 21. No field plate was implemented. The HEMTs were then passivated with low-power, plasma-enhanced chemical vapor deposition (PECVD) silicon nitride with a thickness of 40 nm. Contact holes were formed in the silicon nitride by 6:1 BOE etching to allow probing of the ohmic and gate contact pads. The final HEMT cross-section is shown in FIG. 13.

Figure 16:
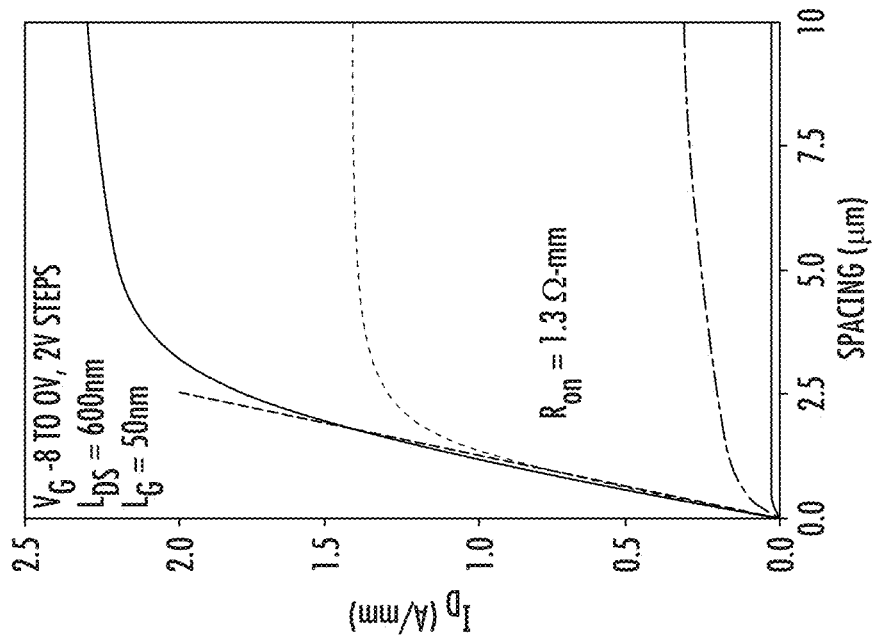
FIG. 16 is a graph of ID/VD curves demonstrating current saturation for ID of about 2.3 A/mm with low Ron=1.3 W-mm for the device of FIG. 13 in some embodiments according to the invention.
Figure 15:
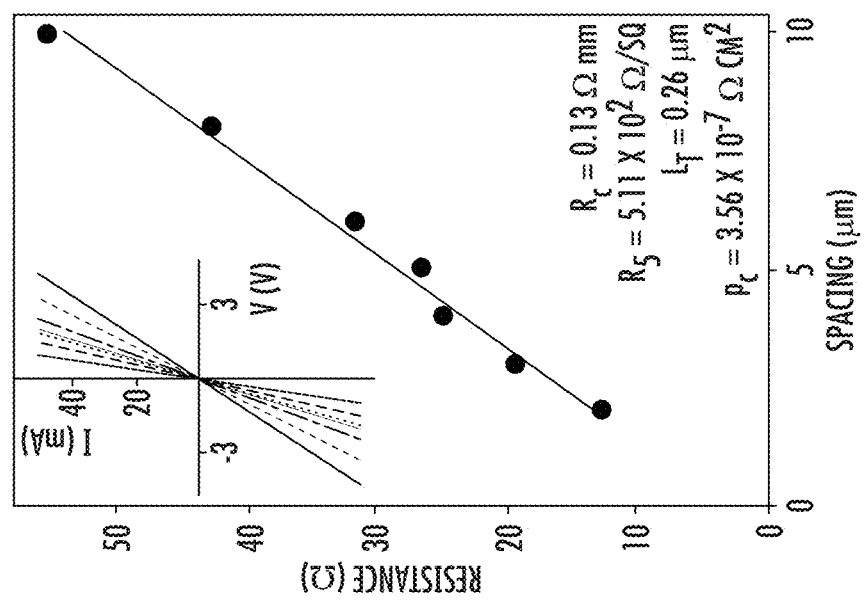
FIG. 15 is a linear TLM analysis of the non-annealed Ti/Au ohmic contacts to the regrown GaN region shown in FIG. 13 in some embodiments according to the invention.
Figure 18:
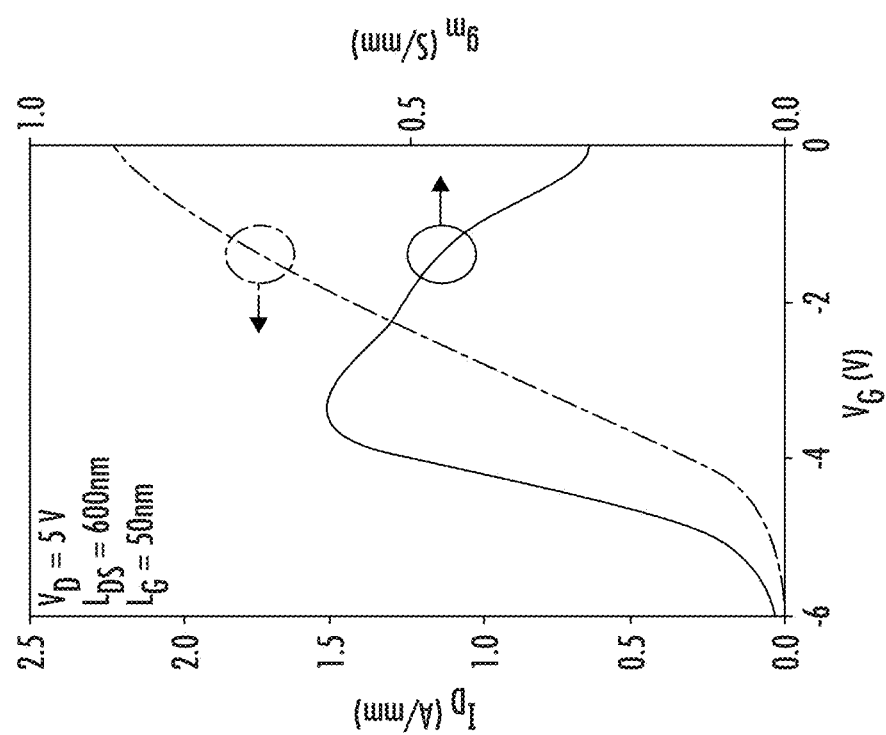
FIG. 18 is a graph of linear transfer curves showing peak gm=0.6 S/mm for the device of FIG. 13 in some embodiments according to the invention.
Figure 17:
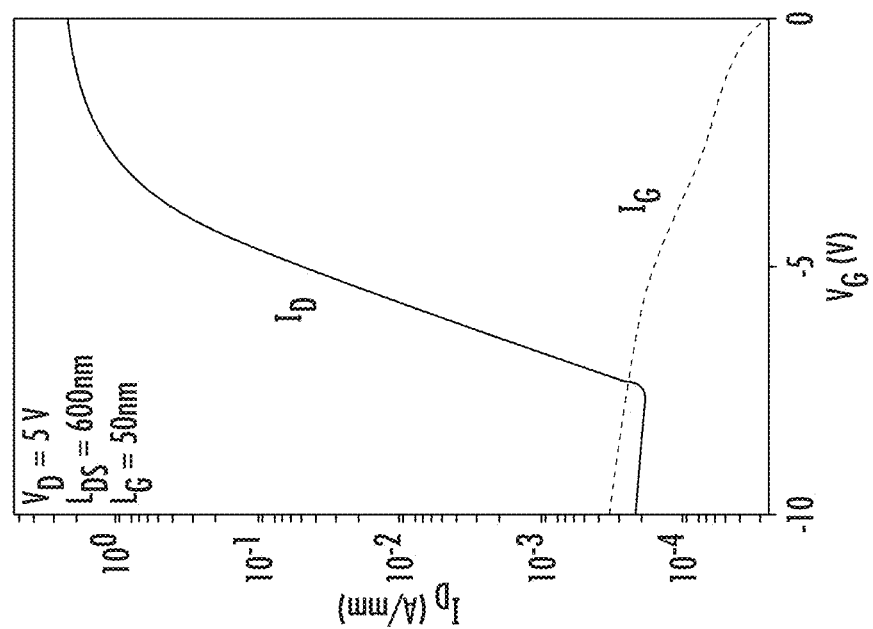
FIG. 17 is a graph of log-scale transfer curves showing on/off ratio of 104 limited by gate leakage current for the device of FIG. 13 in some embodiments according to the invention.

After device fabrication, transfer-length method (TLM) patterns were measured in multiple locations across the sample, revealing ohmic contact to the 2DEG with a contact resistance of Rc=0.13 ohm·mm, shown in FIG. 15. Hall-effect measurements at room temperature after fabrication revealed a 2DEG sheet concentration of $3 \cdot 10^{13}$ cm-2 and an electron mobility of 410 cm2/V·s, resulting in a sheet resistance of 510 □/sq. The sheet resistance increased 50% from its as-grown value, likely due to surface damage induced during the fabrication process and could be potentially avoided by changing the SiO2 deposition process. Transfer I-V characteristics reveal an Ion/Ioff=109 before passivation and 104 after passivation with a peak transconductance of 0.6 S/mm, as shown in FIGS. 17 and 18. The output characteristics, plotted in FIG. 16, show a drain current of ~2.3 A/mm with excellent saturation and on-resistance of 1.3 □·mm.

Figure 20:
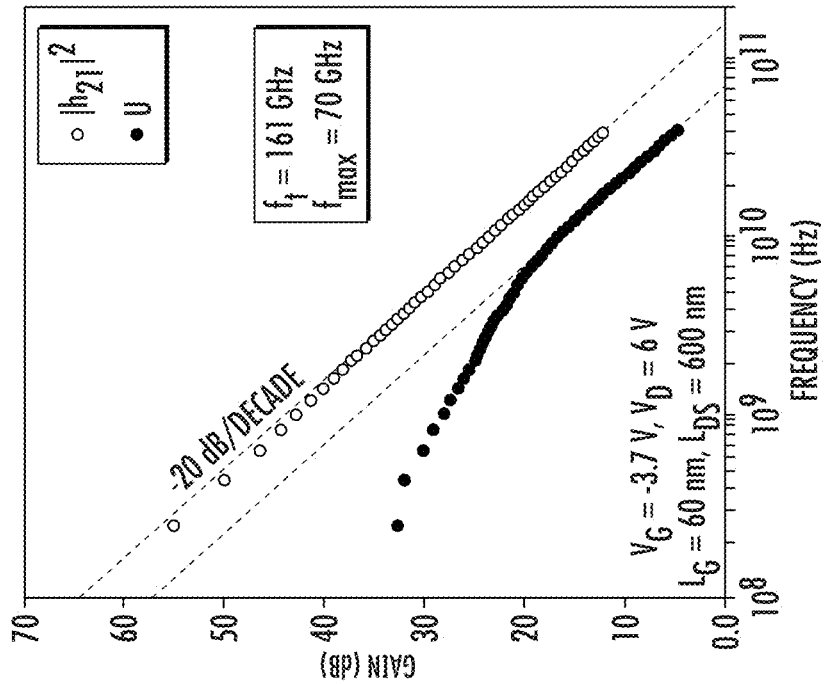
FIG. 20 is a graph showing small-signal measurements of the passivated device of FIG. 19 with ft/fmax=161/70 GHz in some embodiments according to the invention.
Figure 19:
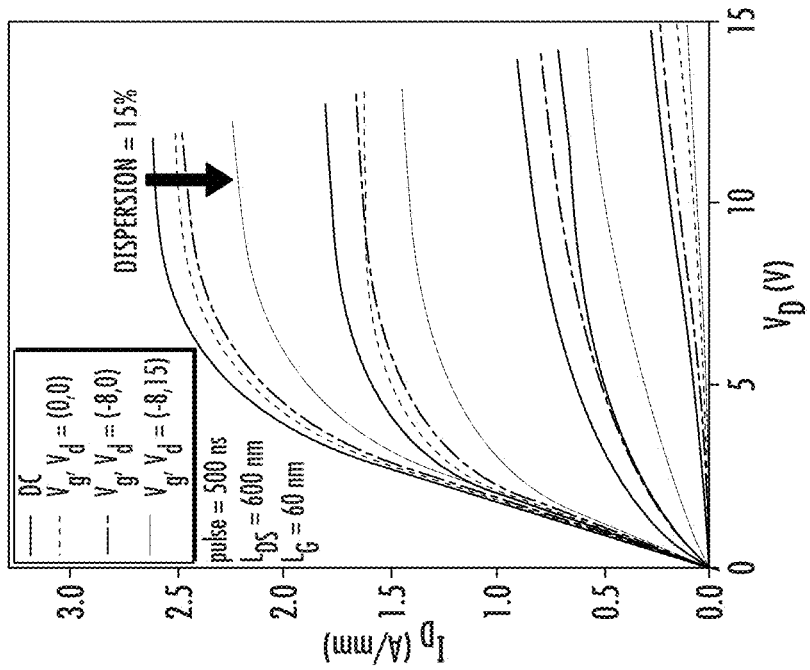
FIG. 19 is a graph showing pulsed IDVD measurements for the device of FIG. 13 having LG=60 nm after SiN passivation and demonstrating dispersion up to about 15 V in some embodiments according to the invention.

Pulsed ID—VDS measurements were performed after silicon nitride passivation to verify dispersion control, shown for a QW HEMT with LG=60 nm in FIG. 19. Bias-dependent S-parameters were then measured in the range of 0.05-40 GHz. The system was de-embedded via a short-open-load-through (SOLT) impedance standard substrate and on-wafer open/short structures. The ft and fmax values were extracted from |h21|2 and unilateral (U) gain plots. The device measured for dispersion also demonstrated ft=161 GHz, fmax=70 GHz, as shown in FIG. 20.

To investigate breakdown characteristics, the gate voltage was set below the threshold voltage (typically VG=-8 V), and VDS was increased until HEMT breakdown occurred. The breakdown voltage metric is defined as ID≥1 mA/mm. QW HEMTs were tested for gate-drain lengths (LGD) ranging from 270 nm to 5.1 μm. The devices were covered in Fluorinert during the measurement process.

Figure 22:
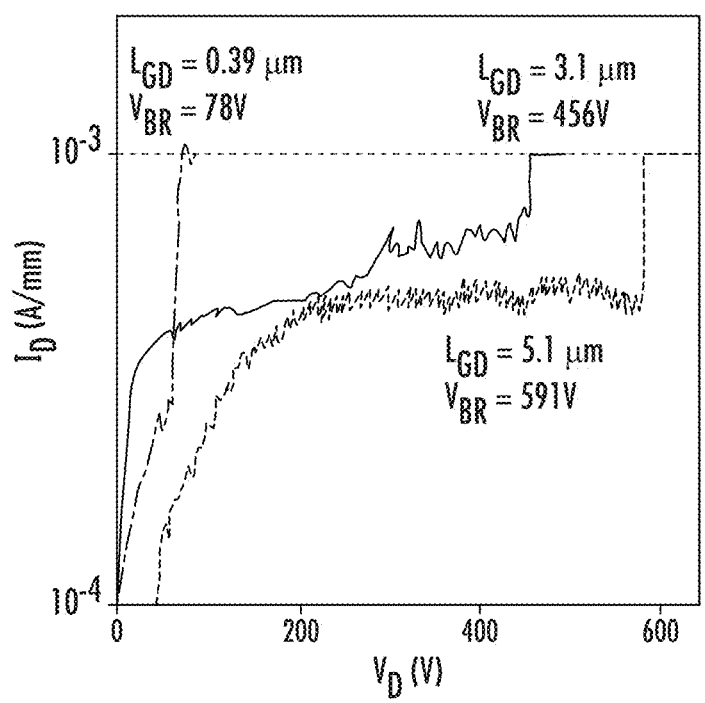
FIG. 22 is a graph showing comparative respective hard breakdown voltages for three AlN/GaN/AlN HEMT devices with varied gate-drain separations in some embodiments according to the invention.

FIG. 22 shows the three terminal off-state breakdown of three QW HEMTs with varied gate-drain distances. Among all devices, the highest breakdown voltage observed is VBD=591 V (LGD=5.1 μm), corresponding to an average electric field (EBD) of 1.16 MV/cm. All measured devices had average electric fields above 1 MV/cm at breakdown. During the measurement process and prior to breakdown, the gate current is found to be roughly equal to the drain current. This indicates the off-state drain current and breakdown is dominated by gate-drain leakage and not avalanche or channel breakdown, and is below the fundamental material limits.

Figure 23:
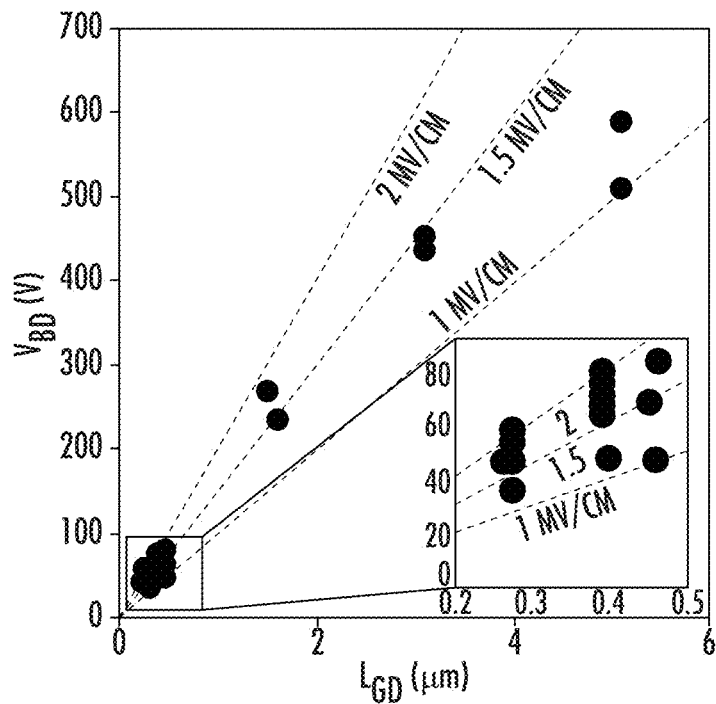
FIG. 23 is a graph showing breakdown voltage scaling for AlN/GaN/AlN HEMT devices as a function of gate-drain separation ranging from 0.27 µm to 5.1 µm in some embodiments according to the invention.

To explore the potential for high-frequency applications, submicron channel lengths were examined for breakdown. A breakdown voltage of 78 V was measured for a HEMT with 390 nm gate-drain distance. This corresponds to an effective breakdown field of 2 MV/cm. FIG. 23 shows the scaling of breakdown voltage as a function of LGD. The breakdown voltage does not scale linearly with LGD, which is expected due to the non-uniform distribution of the E-field within the channel.

Figure 24:
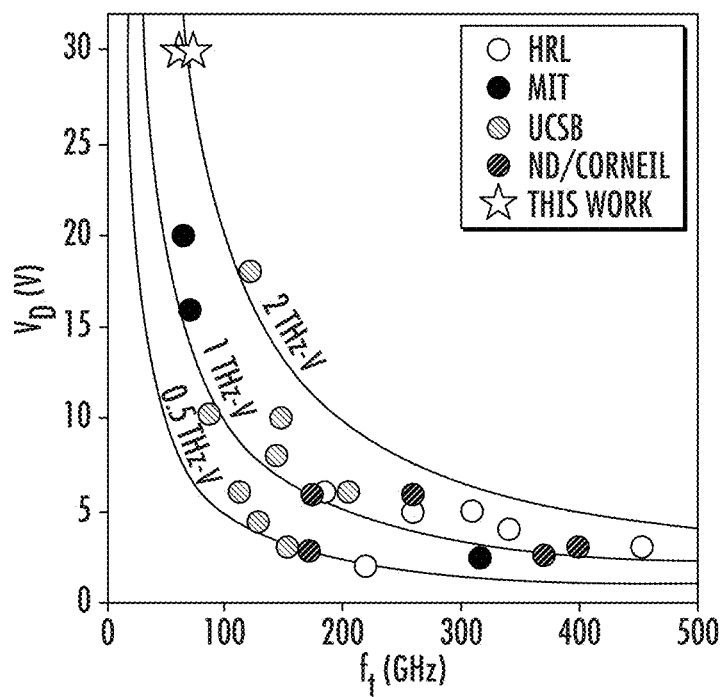
FIG. 24 is a graph showing a Johnson figure of merit benchmark plot comparing an AlN/GaN/AlN HEMT device of FIG. 13 compared to a conventional GaN HEMT device with submicron LGD and no field plate.

Small-signal s-parameters were also measured for two QW HEMTs with LG=80 nm, LGD=460 μm at high drain biases to demonstrate simultaneous high-voltage, high-frequency performance. For a drain bias of 30 V, the devices showed cutoff frequencies of 73 and 62 GHz. The measured cutoff frequency and corresponding drain bias were benchmarked against state-of-the-art GaN HEMTs with submicron LGD and no field plate using the Johnson figure of merit (JFoM), as shown in FIG. 24. The two devices measured at high drain bias yielded JFoM values of 2.2 and 1.9 THz·V. It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the various embodiments described herein. As used herein, the term "and/or" includes any and all combinations of one or more of the associated listed items.

The terminology used herein is for the purpose of describing particular embodiments only and is not intended to be limiting to other embodiments. As used herein, the singular forms "a," "an" and "the" are intended to include the plural forms as well, unless the context clearly indicates otherwise. It will be further understood that the terms "comprises," "comprising," "includes" and/or "including", "have" and/or "having" when used herein, specify the presence of stated features, integers, steps, operations, elements, and/or components, but do not preclude the presence or addition of one or more other features, integers, steps, operations, elements, components, and/or groups thereof. Elements described as being "to" perform functions, acts and/or operations may be configured to or other structured to do so.

Unless otherwise defined, all terms (including technical and scientific terms) used herein have the same meaning as commonly understood by one of ordinary skill in the art to which various embodiments described herein belong. It will be further understood that terms used herein should be interpreted as having a meaning that is consistent with their meaning in the context of this specification and the relevant art and will not be interpreted in an idealized or overly formal sense unless expressly so defined herein.

What is claimed:

1. A High Electron Mobility Transistor (HEMT) device comprising:
   a buffer layer including Al and N on a substrate;
   a channel layer including Ga and N that is lattice matched to and on the buffer layer;
   a barrier layer including Al and N on the channel layer, the barrier layer having a stress in a range between about −200 Mpa and about +200 MPa and to provide a channel region;
   a drain region including Ga and N recessed into the channel layer at a first end of the channel region;
   a source region including Ga and N recessed into the channel layer at a second end of the channel region opposite the first end of the channel region;
   a T-shaped gate electrode at a location on a surface between the drain region and the source region, the T-shaped gate electrode including a neck portion that extends a first distance above the surface to a head portion of the T-shaped gate electrode;
   a gate electrode recess in an uppermost surface of the head portion of the T-shaped gate electrode;
   a passivation layer continuously extending from an upper surface of the drain region to an upper surface of the source region to cover the surface and to cover the T-shaped gate electrode including into the gate electrode recess; and
   a passivation layer recess in an upper surface of the passivation layer above the gate electrode recess, the passivation layer recess having a passivation layer recess shape that conforms to a shape of the gate electrode recess, wherein the barrier layer further includes Sc so that the barrier layer comprises $Sc_xAl_{(1-x)}N$, wherein x is in a range between greater than about 0.01 to about 0.2.

2. The HEMT device of claim 1 wherein the barrier layer has a band gap of about 6 eV at room temperature.

3. The HEMT device according to claim 1 wherein an upper surface of the barrier layer is located about 2 nm or less from an upper surface of the HEMT device extending between the neck portion of the T-shaped gate electrode and the drain region.

4. The HEMT device according to claim 1 wherein the T-shaped gate electrode includes an overhang portion that extends over the channel region toward the drain region by a greater amount than toward the source region.

5. The HEMT device according to claim 4 wherein the passivation layer includes an upper portion on the head portion of the T-shaped gate electrode and a lower portion on the neck portion of the T-shaped gate electrode, and further including a lower portion of the passivation layer that further includes a planar surface extending from the upper portion of the passivation layer to overlap an upper surface of the drain region; and
    wherein the planar surface of the passivation layer is located at a height about equal to that of the overhang portion.

6. The HEMT device according to claim 1 wherein the passivation layer has a uniform thickness on the surface, on the T-shaped gate electrode.

7. The HEMT device according to claim 1 wherein the passivation layer includes an upper portion on the head portion of the T-shaped gate electrode and a lower portion on the neck portion of the T-shaped gate electrode, and further including a lower portion of the passivation layer that further includes a planar surface extending from the upper portion of the passivation layer to overlap an upper surface of the drain region; and
    wherein the planar surface of the passivation layer is located above the upper surface of the drain region.

8. The HEMT device according to claim 1 further comprising:
    a drain ohmic contact on the drain region to provide the upper surface of the drain region.

9. The HEMT device according to claim 1 wherein the passivation layer includes an upper portion on the head portion of the T-shaped gate electrode and a lower portion on the neck portion of the T-shaped gate electrode, and further including a lower portion of the passivation layer that further includes a planar surface extending from the upper portion of the passivation layer to overlap an upper surface of the drain region; and
    wherein the planar surface of the passivation layer comprises a first planar surface, wherein the passivation layer further comprises:
    a second planar surface extending from the upper portion of the passivation layer to overlap an upper surface of the source region.

10. The HEMT device according to claim 1 wherein the passivation layer includes an upper portion on the head portion of the T-shaped gate electrode and a lower portion on the neck portion of the T-shaped gate electrode, and further including a lower portion of the passivation layer that further includes a planar surface extending from the upper portion of the passivation layer to overlap an upper surface of the drain region; and
    wherein the planar surface of the passivation layer is located above the upper surface of the drain region.

11. The HEMT device according to claim 1 wherein the barrier layer provides the surface and the passivation layer is directly on the barrier layer.

12. The HEMT device according to claim 1 further comprising:
    a cap layer including Ga and N, the cap layer directly on the barrier layer.

13. The HEMT device according to claim 1 wherein the channel layer further includes In so that channel layer comprises $In_yGa_{(1-y)}N$, wherein y is in a range between greater than about 0.08 to about 0.12.

14. The HEMT device according to claim 1 wherein the channel layer further includes In or Al.

15. The HEMT device according to claim 1 wherein a spacing between the neck portion of the T-shaped gate electrode and the drain region is in a range between about 600 nm and about 3 microns and the HEMT device has a breakdown voltage in range between about 40 Volts and about 400 Volts.

16. The HEMT device according to claim 15 wherein the breakdown voltage is in range between about 80 Volts and about 400 Volts.

17. A High Electron Mobility Transistor (HEMT) device comprising:
    a buffer layer including Al and N on a substrate;
    a channel layer including Ga and N that is lattice matched to and on the buffer layer;
    a barrier layer including Al and N on the channel layer, the barrier layer having a stress in a range between about −200 Mpa and about +200 MPa and to provide a channel region;
    a drain region including Ga and N recessed into the channel layer at a first end of the channel region;
    a source region including Ga and N recessed into the channel layer at a second end of the channel region opposite the first end of the channel region;
    a T-shaped gate electrode at a location on a surface between the drain region and the source region, the T-shaped gate electrode including a neck portion that extends a first distance above the surface to a head portion of the T-shaped gate electrode;
    a gate electrode recess in an uppermost surface of the head portion of the T-shaped gate electrode;
    a passivation layer continuously extending from an upper surface of the drain region to an upper surface of the source region to cover the surface and to cover the T-shaped gate electrode including into the gate electrode recess; and
    a passivation layer recess in an upper surface of the passivation layer above the gate electrode recess, the passivation layer recess having a passivation layer recess shape that conforms to a shape of the gate electrode recess, wherein the channel layer further includes In so that the channel layer comprises $In_yGa_{(1-y)}N$, wherein y is in a range between greater than about 0.08 to about 0.12.

18. The HEMT device of claim 17 wherein the barrier layer has a band gap of about 6 eV at room temperature.

19. The HEMT device according to claim 17 wherein an upper surface of the barrier layer is located about 2 nm or less from an upper surface of the HEMT device extending between the neck portion of the T-shaped gate electrode and the drain region.

20. The HEMT device according to claim 17 wherein the T-shaped gate electrode includes an overhang portion that extends over the channel region toward the drain region by a greater amount than toward the source region.

21. The HEMT device according to claim 20 wherein the passivation layer includes an upper portion on the head portion of the T-shaped gate electrode and a lower portion on the neck portion of the T-shaped gate electrode, and further including a lower portion of the passivation layer that further includes a planar surface extending from the upper portion of the passivation layer to overlap an upper surface of the drain region; and
    wherein the planar surface of the passivation layer is located at a height about equal to that of the overhang portion.

22. The HEMT device according to claim 17 wherein the passivation layer has a uniform thickness on the surface, on the T-shaped gate electrode.

23. The HEMT device according to claim 17 wherein the passivation layer includes an upper portion on the head portion of the T-shaped gate electrode and a lower portion on the neck portion of the T-shaped gate electrode, and further including a lower portion of the passivation layer that further includes a planar surface extending from the upper portion of the passivation layer to overlap an upper surface of the drain region; and wherein the planar surface of the passivation layer is located above the upper surface of the drain region.

24. The HEMT device according to claim 17 further comprising:

a drain ohmic contact on the drain region to provide the upper surface of the drain region.

25. The HEMT device according to claim 17 wherein the passivation layer includes an upper portion on the head portion of the T-shaped gate electrode and a lower portion on the neck portion of the T-shaped gate electrode, and further including a lower portion of the passivation layer that further includes a planar surface extending from the upper portion of the passivation layer to overlap an upper surface of the drain region; and wherein the planar surface of the passivation layer comprises a first planar surface, wherein the passivation layer further comprises:

a second planar surface extending from the upper portion of the passivation layer to overlap an upper surface of the source region.

26. The HEMT device according to claim 17 wherein the passivation layer includes an upper portion on the head portion of the T-shaped gate electrode and a lower portion on the neck portion of the T-shaped gate electrode, and further including a lower portion of the passivation layer that further includes a planar surface extending from the upper portion of the passivation layer to overlap an upper surface of the drain region; and wherein the planar surface of the passivation layer is located above the upper surface of the drain region.

27. The HEMT device according to claim 17 wherein the barrier layer provides the surface and the passivation layer is directly on the barrier layer.

28. The HEMT device according to claim 17 further comprising:

a cap layer including Ga and N, the cap layer directly on the barrier layer.

29. The HEMT device according to claim 17 wherein the barrier layer further includes Sc so that the barrier layer comprises $Sc_xAl_{(1-x)}N$, wherein x is in a range between greater than about 0.01 to about 0.2.

30. The HEMT device according to claim 17 wherein the channel layer further includes In or Al.

31. The HEMT device according to claim 17 wherein a spacing between the neck portion of the T-shaped gate electrode and the drain region is in a range between about 600 nm and about 3 microns and the HEMT device has a breakdown voltage in range between about 40 Volts and about 400 Volts.

32. The HEMT device according to claim 31 wherein the breakdown voltage is in range between about 80 Volts and about 400 Volts.

33. A High Electron Mobility Transistor (HEMT) device comprising:

a buffer layer including Al and N on a substrate;

a channel layer including Ga and N that is lattice matched to and on the buffer layer;

a barrier layer including Al and N on the channel layer, the barrier layer having a stress in a range between about −200 Mpa and about +200 MPa and to provide a channel region;

a drain region including Ga and N recessed into the channel layer at a first end of the channel region;

a source region including Ga and N recessed into the channel layer at a second end of the channel region opposite the first end of the channel region;

a T-shaped gate electrode at a location on a surface between the drain region and the source region, the T-shaped gate electrode including a neck portion that extends a first distance above the surface to a head portion of the T-shaped gate electrode;

a gate electrode recess in an uppermost surface of the head portion of the T-shaped gate electrode;

a passivation layer continuously extending from an upper surface of the drain region to an upper surface of the source region to cover the surface and to cover the T-shaped gate electrode including into the gate electrode recess; and a passivation layer recess in an upper surface of the passivation layer above the gate electrode recess, the passivation layer recess having a passivation layer recess shape that conforms to a shape of the gate electrode recess, wherein the channel layer further includes In or Al.

34. The HEMT device of claim 33 wherein the barrier layer has a band gap of about 6 eV at room temperature.

35. The HEMT device according to claim 33 wherein an upper surface of the barrier layer is located about 2 nm or less from an upper surface of the HEMT device extending between the neck portion of the T-shaped gate electrode and the drain region.

36. The HEMT device according to claim 33 wherein the T-shaped gate electrode includes an overhang portion that extends over the channel region toward the drain region by a greater amount than toward the source region.

37. The HEMT device according to claim 36 wherein the passivation layer includes an upper portion on the head portion of the T-shaped gate electrode and a lower portion on the neck portion of the T-shaped gate electrode, and further including a lower portion of the passivation layer that further includes a planar surface extending from the upper portion of the passivation layer to overlap an upper surface of the drain region; and wherein the planar surface of the passivation layer is located at a height about equal to that of the overhang portion.

38. The HEMT device according to claim 33 wherein the passivation layer has a uniform thickness on the surface, on the T-shaped gate electrode.

39. The HEMT device according to claim 33 wherein the passivation layer includes an upper portion on the head portion of the T-shaped gate electrode and a lower portion on the neck portion of the T-shaped gate electrode, and further including a lower portion of the passivation layer that further includes a planar surface extending from the upper portion of the passivation layer to overlap an upper surface of the drain region; and wherein the planar surface of the passivation layer is located above the upper surface of the drain region.

40. The HEMT device according to claim 33 further comprising:
    a drain ohmic contact on the drain region to provide the upper surface of the drain region.

41. The HEMT device according to claim 33 wherein the passivation layer includes an upper portion on the head portion of the T-shaped gate electrode and a lower portion on the neck portion of the T-shaped gate electrode, and further including a lower portion of the passivation layer that further includes a planar surface extending from the upper portion of the passivation layer to overlap an upper surface of the drain region; and
    wherein the planar surface of the passivation layer comprises a first planar surface, wherein the passivation layer further comprises:
        a second planar surface extending from the upper portion of the passivation layer to overlap an upper surface of the source region.

42. The HEMT device according to claim 33 wherein the passivation layer includes an upper portion on the head portion of the T-shaped gate electrode and a lower portion on the neck portion of the T-shaped gate electrode, and further including a lower portion of the passivation layer that further includes a planar surface extending from the upper portion of the passivation layer to overlap an upper surface of the drain region; and
    wherein the planar surface of the passivation layer is located above the upper surface of the drain region.

43. The HEMT device according to claim 33 wherein the barrier layer provides the surface and the passivation layer is directly on the barrier layer.

44. The HEMT device according to claim 33 further comprising:
    a cap layer including Ga and N, the cap layer directly on the barrier layer.

45. The HEMT device according to claim 33 wherein the barrier layer further includes Sc so that the barrier layer comprises $Sc_xAl_{(1-x)}N$, wherein x is in a range between greater than about 0.01 to about 0.2.

46. The HEMT device according to claim 33 wherein the channel layer further includes In so that channel layer comprises $In_yGa_{(1-y)}N$, wherein y is in a range between greater than about 0.08 to about 0.12.

47. The HEMT device according to claim 33 wherein a spacing between the neck portion of the T-shaped gate electrode and the drain region is in a range between about 600 nm and about 3 microns and the HEMT device has a breakdown voltage in range between about 40 Volts and about 400 Volts.

48. The HEMT device according to claim 47 wherein the breakdown voltage is in range between about 80 Volts and about 400 Volts.

\* \* \* \* \*